(12) United States Patent
Hino et al.

(10) Patent No.: US 6,168,910 B1
(45) Date of Patent: Jan. 2, 2001

(54) METHOD FOR REMOVING RESIDUE AND METHOD FOR PRODUCTION OF PRINTED BOARD HAVING HOLE

(75) Inventors: Atsushi Hino; Hitoshi Ishizaka, both of Ibaraki (JP)

(73) Assignee: Nitto Denko Corporation, Osaka (JP)

( * ) Notice: Under 35 U.S.C. 154(b), the term of this patent shall be extended for 0 days.

(21) Appl. No.: 09/334,643

(22) Filed: Jun. 17, 1999

Related U.S. Application Data (62) Division of application No. 08/988,138, filed on Dec. 10, 1997, now Pat. No. 6,037,103.

(30) Foreign Application Priority Data

Dec. 11, 1996 (JP) .................................................. 8-331099
Dec. 11, 1996 (JP) .................................................. 8-331285

(51) Int. Cl.$^7$ ........................................................ G03F 7/26
(52) U.S. Cl. ........................ 430/328; 430/329; 430/945; 134/1.3; 438/940
(58) Field of Search ................... 204/157.22; 264/400; 438/940; 430/311, 329, 328, 945; 134/1.3

(56) References Cited

U.S. PATENT DOCUMENTS

| | | | |
|---|---|---|---|
| 5,114,834 | * 5/1992 | Nachshon | 430/329 |
| 5,294,567 | 3/1994 | Dorfman et al. | 437/187 |
| 5,674,414 | 10/1997 | Schweizer | 219/121.77 |
| 5,676,866 | 10/1997 | In Den Baumen et al. | 219/121.77 |

FOREIGN PATENT DOCUMENTS

| | | |
|---|---|---|
| 0 679 469 A1 | 11/1995 | (EP) . |
| 5-198496 | * 8/1993 | (JP) . |
| 07290264 | 11/1995 | (JP) . |
| 8-323488 | * 12/1996 | (JP) . |
| 09029473 | 2/1997 | (JP) . |
| 10-173318 | * 6/1998 | (JP) . |
| 10-341069 | * 12/1998 | (JP) . |

* cited by examiner

Primary Examiner—Kathleen Duda
(74) Attorney, Agent, or Firm—Sughrue, Mion, Zinn, Macpeak & Seas, PLLC (57) ABSTRACT

A method is disclosed for removing a decomposition residue and/or a processing residue, of a material of a resin layer, which is attached to the periphery and inside of holes formed in the resin layer of a printed board. The method provides shooting a laser beam having a wavelength for laser ablation at the holes to thereby remove the decomposition residue and/or the processing residue; reshaping the sectional shape perpendicular to the direction of advance of the laser beam by beam reshaping optics; and shooting the reshaped laser beam to shoot simultaneously all the holes formed in the resin layer and vicinity thereof, wherein the total irradiated area on the printed board is 200%–10,000% of the total sectional area of the holes formed in the printed board. Also disclosed is a method for producing a printed board having holes that provides for: forming holes in a resin layer of a printed board by laser processing and removing a decomposition residue and/or a processing residue, of a material of the resin layer, which is attached to the periphery and inside of the holes.

5 Claims, 11 Drawing Sheets

METHOD FOR REMOVING RESIDUE AND METHOD FOR PRODUCTION OF PRINTED BOARD HAVING HOLE

This is a divisional of application Ser. No. 08/988,138 filed Dec. 10, 1997 U.S. Pat. No. 6,037,103, the disclosure of which is incorporated herein by reference.

FIELD OF THE INVENTION

The present invention relates to a method for producing a printed board. More particularly, the present invention relates to a high-precision, low cost technique for forming a through-hole or dead-end hole in a printed resin board, and to a technique for reducing the amount of resin residue remaining inside or around the hole.

BACKGROUND OF THE INVENTION

Along with the recent miniaturization and high functionalization of electronics, a printed board used for mounting a semiconductor or testing has been increasingly required to permit fine and high density wiring. As a result, a hole formed for providing a protruding contact point and the like as a probe on a printed board needs to be fine and formed at high densities.

In particular, fine holes having a diameter of not more than 100 μm are advantageously formed by laser ablation. As the light source for such hole-forming, an excimer laser is particularly preferable. The excimer laser has an oscillation wavelength of not more than 400 nm, and laser ablation using said laser for resin decomposition enables formation of fine holes having a diameter of not more than 100 μm with high precision.

On the other hand, laser ablation is uneconomical due to its high processing cost caused by the long processing time necessary for forming holes and low energy utilization efficiency, as explained in the following.

Figure 5:
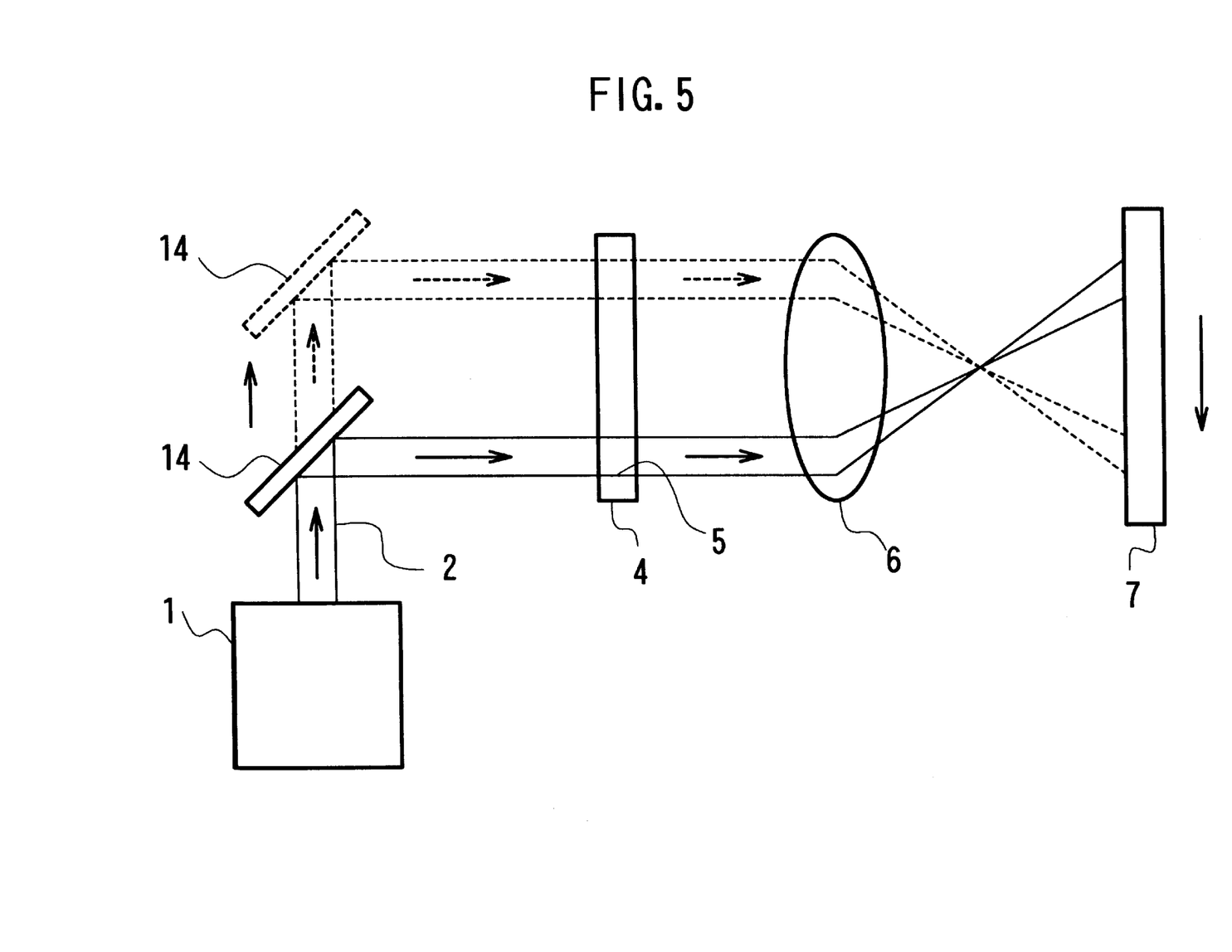
FIG. 5 shows a conventional method for forming a hole in a printed board using an excimer laser, wherein a hole is formed in the printed board by a mask imaging method.

FIG. 5 shows an embodiment of conventional processing, wherein a laser beam 2 is output from a light source 1 (excimer laser), passes through a scanning mirror 14, a mask 4 and an imaging lens 6, and hits a printed board 7 to form a through-hole. Such a method for forming a hole (inclusive of through-hole and dead-end hole) which comprises shooting a laser beam through the mask 4, the mask 4 having light path holes 5 for the passage of the light, which correspond to the holes to be formed in the printed board 7, wherein the laser beam 2 which passed the light path holes 5 ablates the printed board 7 and forms holes, is a mask imaging method.

Figure 6:
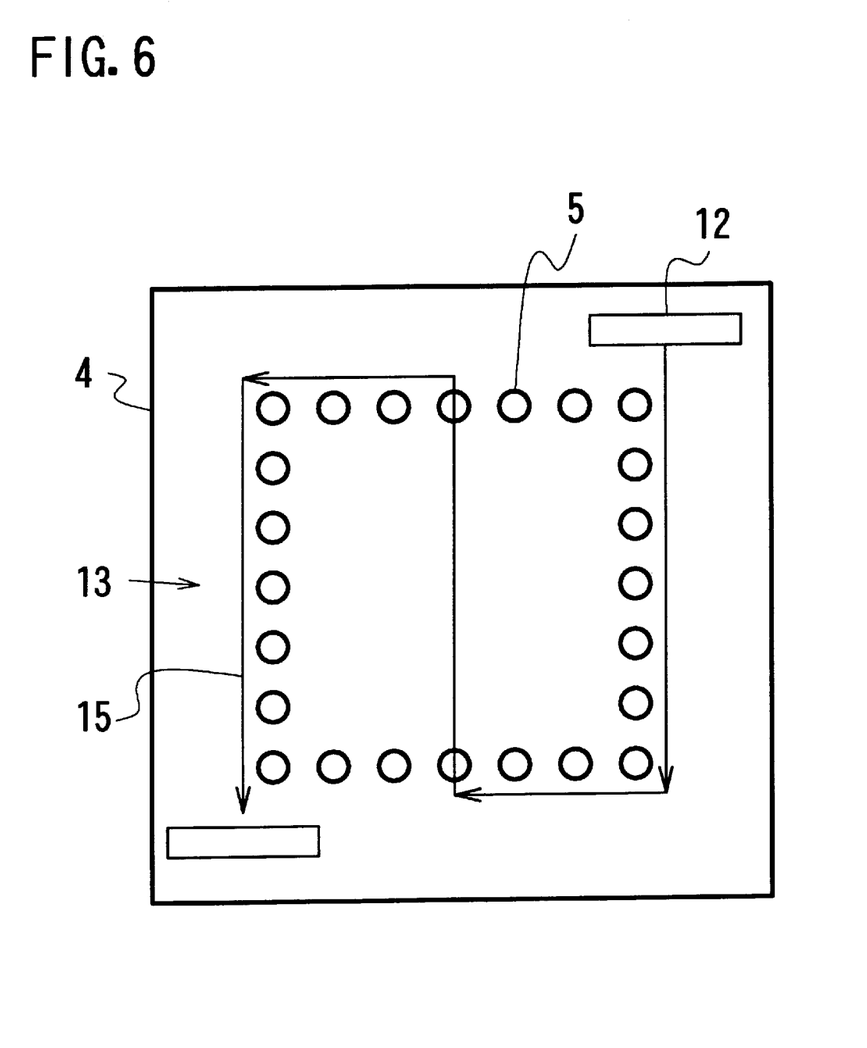
FIG. 6 shows laser beam irradiation areas on a mask by conventional hole forming method using an excimer laser.

As shown in FIG. 6 wherein conventional laser ablation is used, when the entire pattern 13 of the arrangement of the light path holes 5 formed in a mask 4 is greater in size than the sectional area 12 (the size of the section perpendicular to the advance direction of said beam, namely, the size of irradiation area) of the laser beam, the laser beam needs to be moved for scanning.

For example, the laser beam irradiation area should be moved to sequentially follow the pattern 13 of the light path holes 5 (e.g., route 15 shown by arrows in the embodiment of FIG. 6), so that the laser beam successively passes the light path holes 5. In the embodiment of FIG. 5, for example, the scanning mirror 14 is moved to change the irradiation area of the laser beam 2 on the mask. Consequently, some time is necessary for completing entire holes, thus increasing the processing cost.

Figure 7:
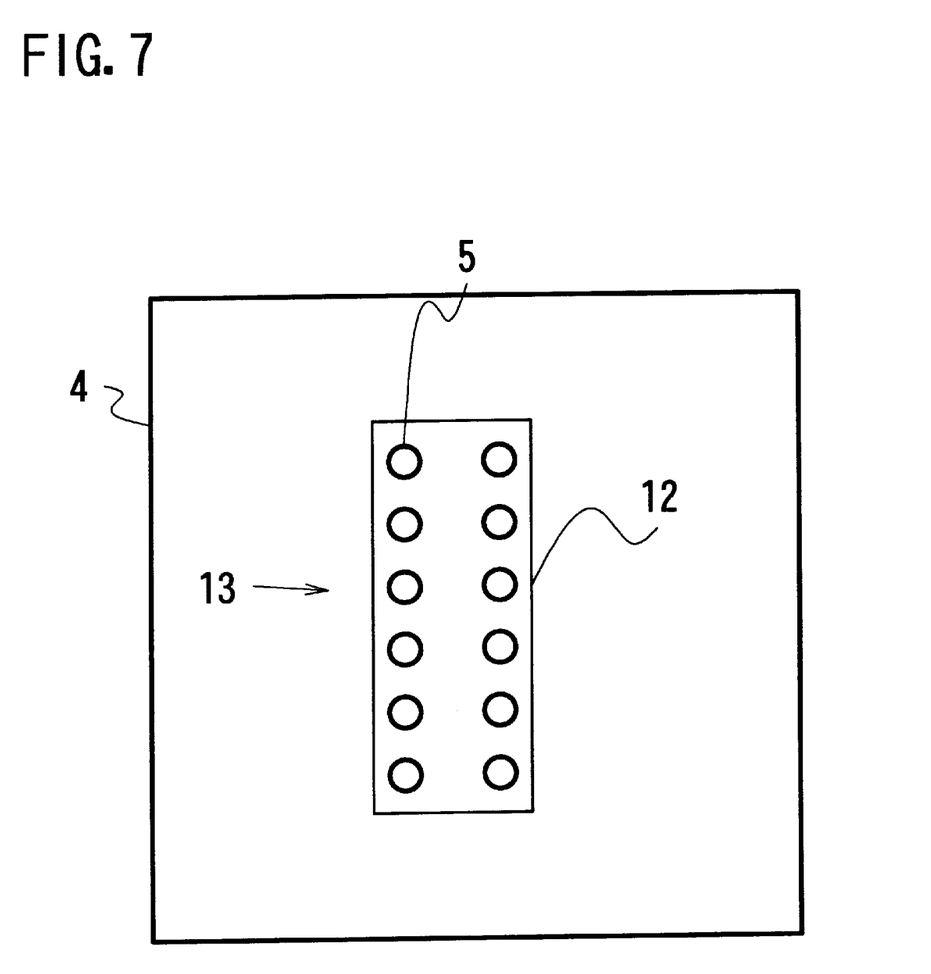
FIG. 7 shows a laser beam irradiation area on a mask by conventional hole forming method using an excimer laser.

As shown in FIG. 7, moreover, when the entire pattern 13 of the arrangement of the light path holes 5 is smaller in size than the sectional area 12 of the laser beam, the total sectional area (area of the section perpendicular to the axis of the hole) of the light path holes 5 becomes much smaller than the sectional area of the beam, so that only a part of the energy of the laser beam output from the light source passes the holes, wasting the light prevented by the mask. Consequently, this method is uneconomical with low energy utilization efficiency.

For forming a probe, Japanese Patent Unexamined Publication No. 2-129938 proposes a method for producing a circuit board, which comprises forming, by laser processing, fine through-holes in an insulating resin film having a conductive circuit in the thickness direction of said insulating resin film, filling the through-holes with a metallic material to be a contact material by a method such as plating, and forming a bump electrode by allowing further protrusion.

When the hole in which a bump electrode is to be formed is provided by various laser beams having a relatively high output power, such as $CO_2$ laser, YAG laser and excimer laser, the residue produced thereby imposes a different problem.

Figure 8A:
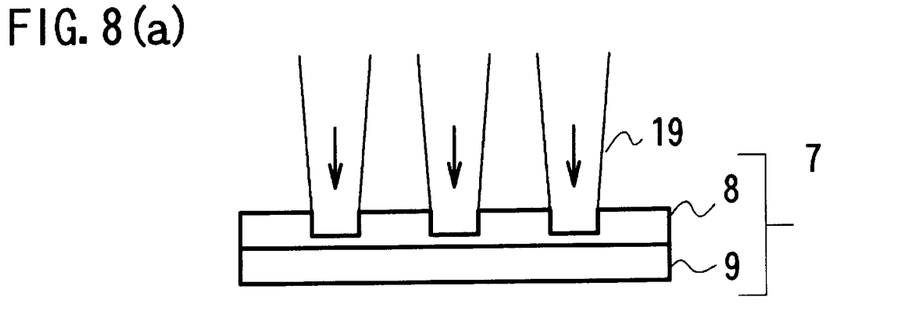
FIG. 8(a) to FIG. 8(e) show the steps of removing residue and producing a printed board having holes according to the present invention, wherein only the lines appearing in the cross section are shown.
Figure 8B:
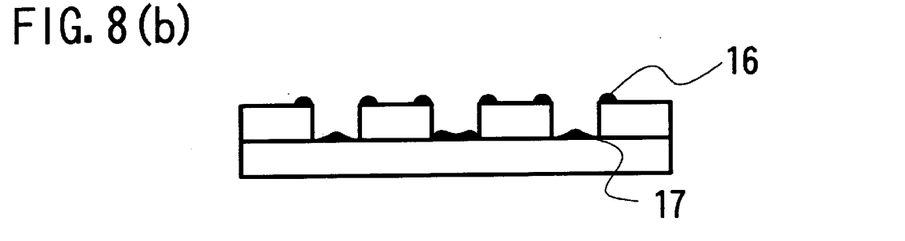

For example, when a through-hole is formed in a resin layer by $CO_2$ laser, YAC laser and the like and a conductive circuit is exposed on the inner bottom of said hole, a slight amount of a processing residue is produced on the exposed conductive circuit, as shown in FIG. 8(b), due to which a bump electrode cannot be formed.

In the ablation processing using excimer laser beam, the material of the resin layer which absorbed the laser beam is decomposed and diffused, and, as shown in FIG. 8(b), adheres not only to the inside of the through-hole but to the circumference of said hole as a decomposition residue. When the decomposition residue is present around the hole during the growth of a bump electrode, the main component, carbon, causes unintended growth of the bump electrode extending from the hole in the planar direction of the resin layer to result in short circuit between neighboring bump electrodes and variation in height and outer diameters of the bump electrodes, thus resulting in possible occurrence of defective products.

The processing residue and decomposition residue produced by the above-mentioned laser processing cannot be removed sufficiently by a mechanical removing means using a brush and the like, immersion in water or organic solvent, ultrasonic vibration and the like. In particular, when the center pitch or diameter of the through-hole is not more than several dozen gm, this problem becomes prominent.

It is therefore an object of the present invention to provide a method for forming a hole by laser ablation capable of forming a hole in the resin layer of a printed board at a higher speed with an improved energy utility efficiency, while producing less amount of residue.

It is another object of the present invention to provide a method for removing a residue remaining inside and in the circumference of the hole provided in the resin layer of a printed board, by adapting the above-mentioned processing method of the present invention.

SUMMARY OF THE INVENTION

According to the present invention, when the resin layer of a printed board is exposed to a laser beam having a wavelength permitting laser ablation processing, by a mask imaging method to form a hole, the sectional shape of the laser beam (section perpendicular to the advance direction of said beam) is so reshaped by beam reshaping optics as to individually cover all light path holes corresponding to the holes to be formed, such that the reshaped beam individually shoots the light path holes in the mask at once. The sectional areas of the beams covering individual light path holes upon irradiation of the mask may or may not be connected with the areas of adjacent path holes. The total area thereof is 100%–2000% of the total sectional area (sectional area perpendicular to the axis of the hole) of the light path holes formed in the mask. The laser beam is shot to simultaneously cover said light path holes to form the holes at once.

According to the present invention, moreover, the decomposition residue and/or processing residue of a resin layer material which are/is attached to the periphery or inside of the holes formed by laser processing the resin layer of a printed board are removed by exposure to a laser beam having a wavelength permitting laser ablation processing.

DETAILED DESCRIPTION OF THE INVENTION

Figure 1:
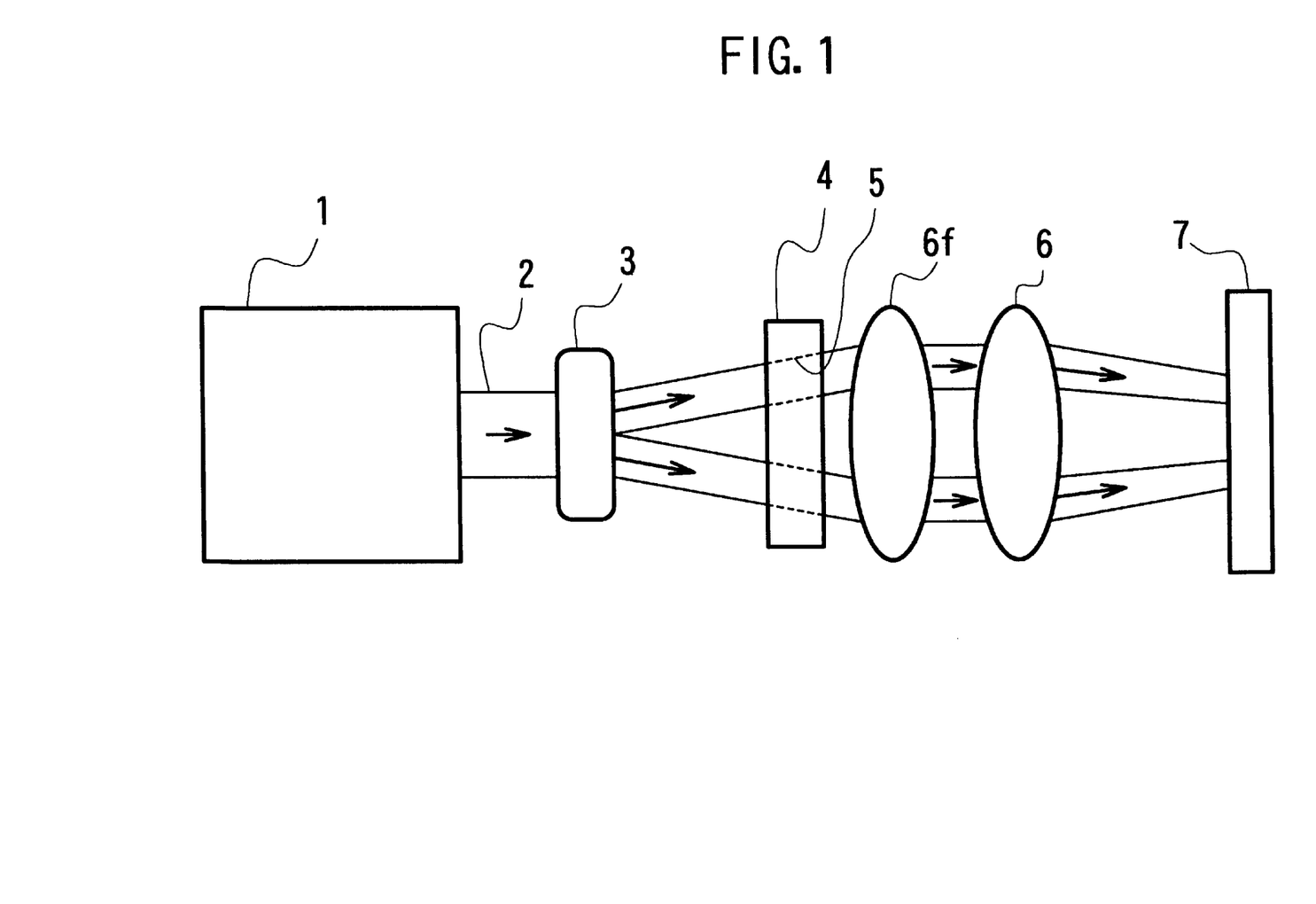
FIG. 1 shows one embodiment of the inventive method for forming a hole in a printed board and a production method of a printed board having a hole by using said method.

FIG. 1 shows one embodiment of the inventive method for forming a hole in a printed board and a production method of a printed board having a hole by using said method, wherein a laser beam is used for forming a through-hole in the printed board.

In this embodiment, a laser beam 2 output from an excimer laser which is a light source 1, has a sectional shape modified by beam reshaping optics 3, such that the light path holes 5 in the mask 4, which correspond to the holes to be formed in the printed board 7, are exposed to a laser beam at once. The sectional shape of each reshaped beam individually covers the corresponding light path hole 5. One such area covering one light path hole 5 may or may not be connected with a next area, which means that each area may be joined with the next area to occupy a larger area or may be separated from each other. The total of such areas, i.e., the total sectional area of the reshaped beam, is 100%–2000% of the total sectional area of the light path holes 5. Only a part of the laser beam 2 having a reshaped sectional shape, which passes the light path holes 5 formed in the mask 4, passes through an imaging lens 6 and forms holes in the printed board 7 at once. In FIG. 1, 6f shows a field lens used for collecting the beams which passed through the mask, toward the imaging lens 6.

By the beam reshaping optics installed between the laser source and the mask, the sectional shape of the laser beam, namely, sectional shape of the beam perpendicular to the direction of advance, can be reshaped. As a result, when the pattern of the light path holes is larger in size than the sectional shape of the laser beam, the laser beam can be made to simultaneously pass through the light path holes in the mask, which holes corresponding to the holes to be formed, thereby obliterating the need for scanning, and thus shortening the processing time.

According to the present invention, the laser beam conventionally wasted by being shut off by a mask can be also directed to each light path hole. Consequently, the sectional area of the reshaped beam becomes 100%–2000% of the total sectional area of the light path holes formed in the mask. Thus, the energy can be fully utilized and the energy utilization efficiency can be improved.

According to the conventional scan processing, the decomposition product of the resin layer produced by a laser beam irradiation may enter a hole formed earlier. Thus, subsequent plating for forming a bump electrode may lead to an abnormal growth of the bump electrode. According to the present invention, however, the holes are formed at once, and thus, the processing time can be shortened and the decomposition product does not enter the hole.

The laser source to be a light source may be any as long as it outputs a laser beam having a wavelength for laser ablation processing. Examples thereof include an excimer laser source as shown in FIG. 1. Particularly preferred are XeCl excimer laser source having an oscillation wavelength of 308 nm and KrF excimer laser source having an oscillation wavelength of 248 nm. Besides these, a source generating third and fourth harmonic YAG laser and a source generating second harmonic Ar ion laser and Kr ion laser are preferably used.

A printed board may be any as long as it has a resin layer. A conductive layer may be formed on either side or both sides of the resin layer. The conductive layer may be a conductive circuit. The conductive layer or conductive circuit may be formed before or after forming a hole in a resin layer or removal of a residue, and is not particularly limited.

The resin layer is not particularly limited as long as holes can be formed therein by a laser beam output from a laser source and it has electric insulating property. Examples of the resin include polyester resin, epoxy resin, urethane resin, polystyrene resin, polyethylene resin, polyamide resin, polyimide resin, ABS resin, polycarbonate resin, silicone resin and the like, which can be selected irrespective of them being thermosetting or thermoplastic. Of these resins, polyimide resin having superior heat resistance, chemical resistance and mechanical strength is preferable.

The thickness of the resin layer is not particularly limited but can be optionally determined. In view of the accuracy of thickness (less variation) and laser processing performance, it is preferably 5 μm–200 μm, particularly 10 μm–100 μm.

As the conductive layer, a laminate obtained by sputtering and evaporation, a metal foil formed to have layers and the like may be used. The material of the conductive layer may be any metal having a conductivity. Examples thereof include copper, gold, nickel, iron, silver, palladium and alloys thereof. When a conductive layer is a conductive circuit, such can be formed by a known method such as subtractive method and additive method.

The holes formed by the method of the present invention may be used for forming bump electrodes as shown in FIG. 2 or for forming through-holes by plating the entire inner surface thereof with a metal. Besides these, they may be used for forming an ink jet nozzle, filter and the like.

Figures 2A, 2B, 2C:
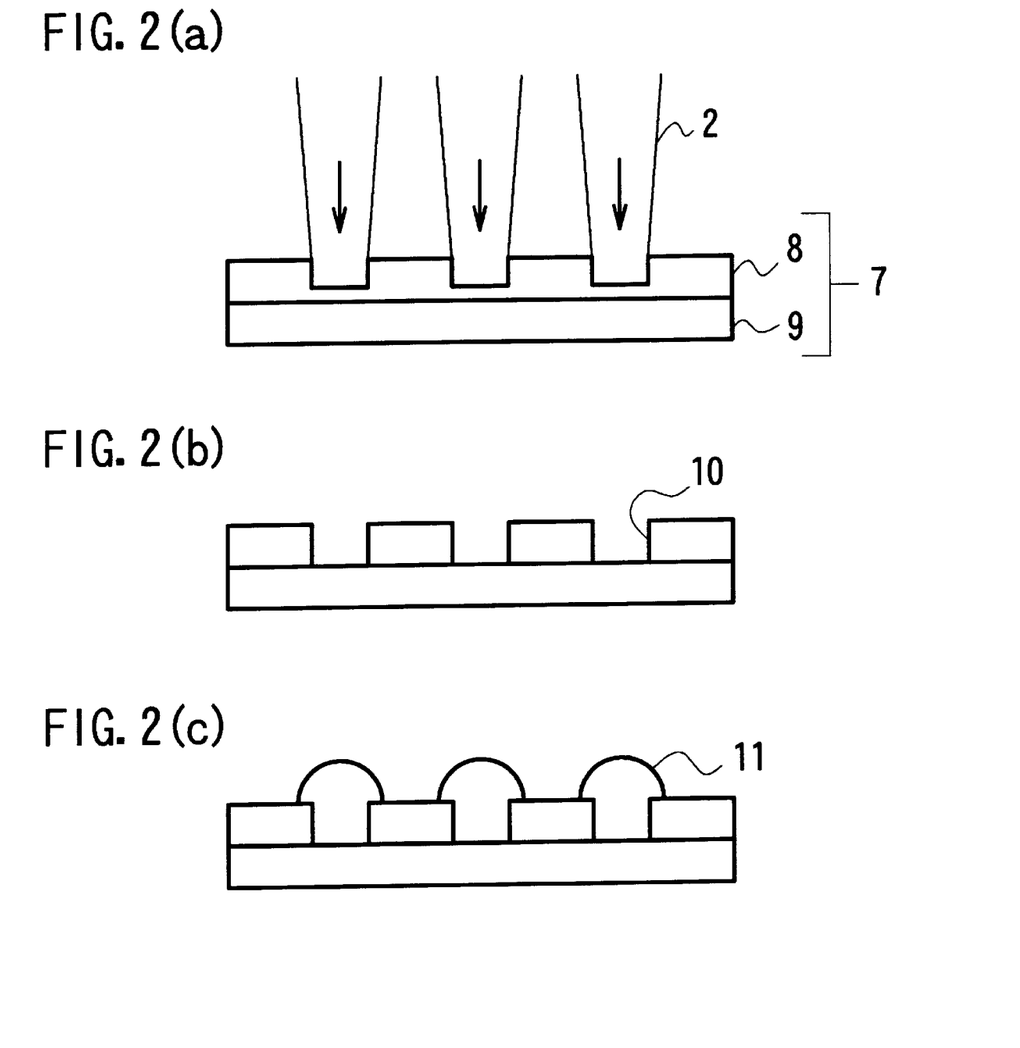
FIG. 2(a) to FIG. 2(c) are sectional views showing the steps of forming holes in a printed board according to the present invention and bump electrodes, wherein only the lines appearing in the cross section are shown.

In FIG. 2(a), holes are formed by exposure of a resin layer 8 of a printed board 7 having a conductive layer 9 on one side of the resin layer 8, to a laser beam 2.

In FIG. 2(b), a hole 10 is formed in a resin layer 8 and a laser beam irradiation has been stopped. Note that a conductive layer 9 is exposed on the inner bottom of the hole 10.

In FIG. 2(c), a metal material to be a bump electrode is filled in the hole 10 by electroplating using the conductive layer 9 as a negative electrode, and the metal material is extruded to form a bump electrode 11.

The beam reshaping optics is set before the mask relative to the light source. In the present invention, the beam reshaping optics is used to reshape the sectional shape of the laser beam from the light source. The sectional shape is such that enables simultaneous exposure of the light path holes in the mask which correspond to the holes to be formed to the beam. In other words, the sectional shape includes the areas of respective light path holes. The areas respectively covering the light path holes may or may not be connected with the adjacent areas. The total sectional area of the beam is 100%–2000% of the sectional area of the light path holes.

In the embodiments of FIG. 3, the sectional shapes 12 of the beams shooting the masks 4 have been reshaped by the beam reshaping optics, so that the entire light path holes 5 formed in the masks 4 can be shot by the laser beams at once.

Figure 3A:
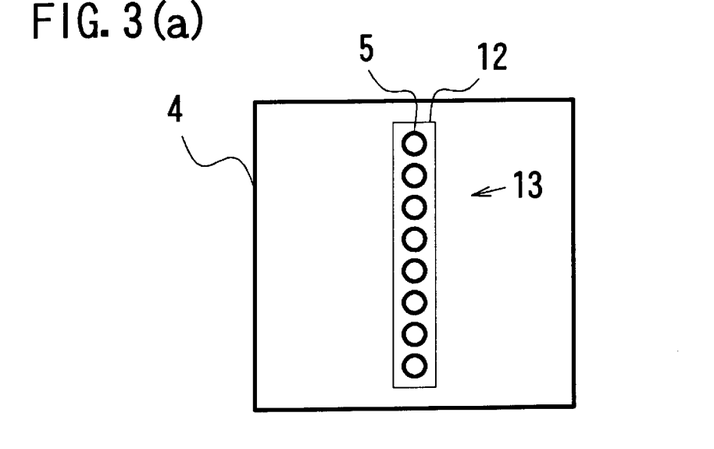
FIG. 3(a) to FIG. 3(c) show examples of the sectional shape of the beam reshaped by beam reshaping optics in the present invention.
Figure 3B:
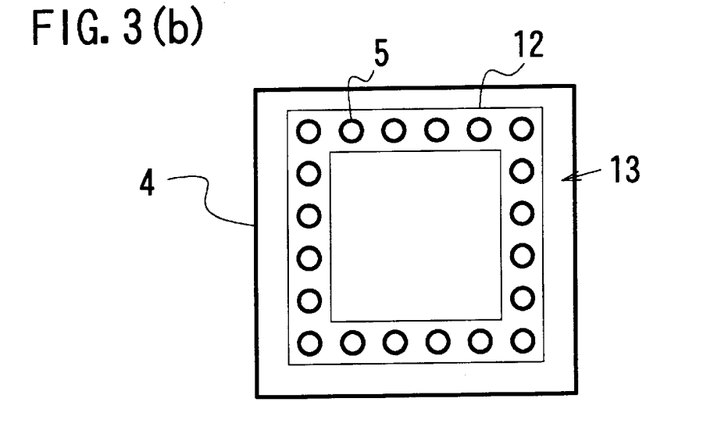
Figure 3C:
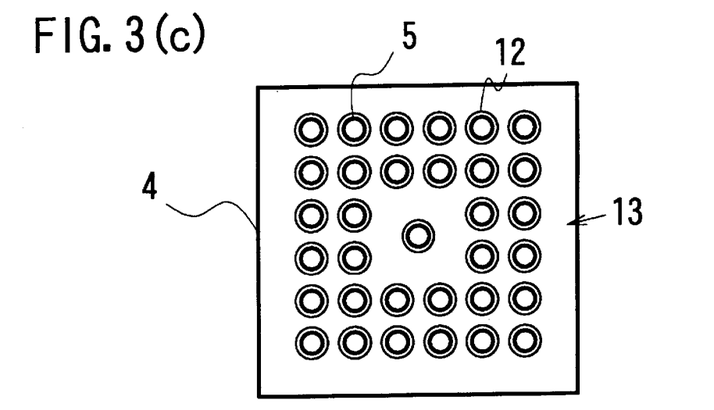

In the embodiments of FIG. 3(a) and FIG. 3(b), the sectional shapes of the beam respectively cover all light path holes, wherein the areas covering respective light path holes are connected. In the embodiment of FIG. 3(c), the sectional shapes of the beams again respectively cover all light path holes, but the areas covering respective light path holes are not connected.

The area of the sectional shape of the beam reshaped by the beam reshaping optics, namely, the total area covering individual light path holes, is 100%–2000% of the total sectional area of the light path holes formed in the mask. When the total sectional area exceeds 2000%, the energy used for actual processing decreases, which in turn lowers the processing speed.

The beam reshaping optics may be any as long as it can reshape the sectional shape of the beam into a desired one. When the pattern 13 of the arrangement of the light path holes is like a line as shown in FIG. 3(a), a beam homogenizer can be used which reshapes or combines the beams to form a line with a combination lens.

When the pattern 13 of the arrangement of the light path holes is like a square frame as shown in FIG. 3(b) or a matrix as shown in FIG. 3(c), the above-mentioned combination of the lens is not usable. In this case, the beam reshaping optics may be a diffractive optical element alone or in combination with other lens. The diffractive optical element has a lens function and an optical energy distribution conversion function utilizing the diffractive phenomenon of light due to fine irregularities formed on the surface of an optical glass.

The mask may be any as long as it has light path holes corresponding to the shape of the holes to be formed in a printed board, the arrangement pattern thereof and the like, and one used for mask imaging method can be used.

The material of the mask is preferably those which are not easily damaged by a laser beam, such as fused quartz and synthesized quartz.

Figure 4:
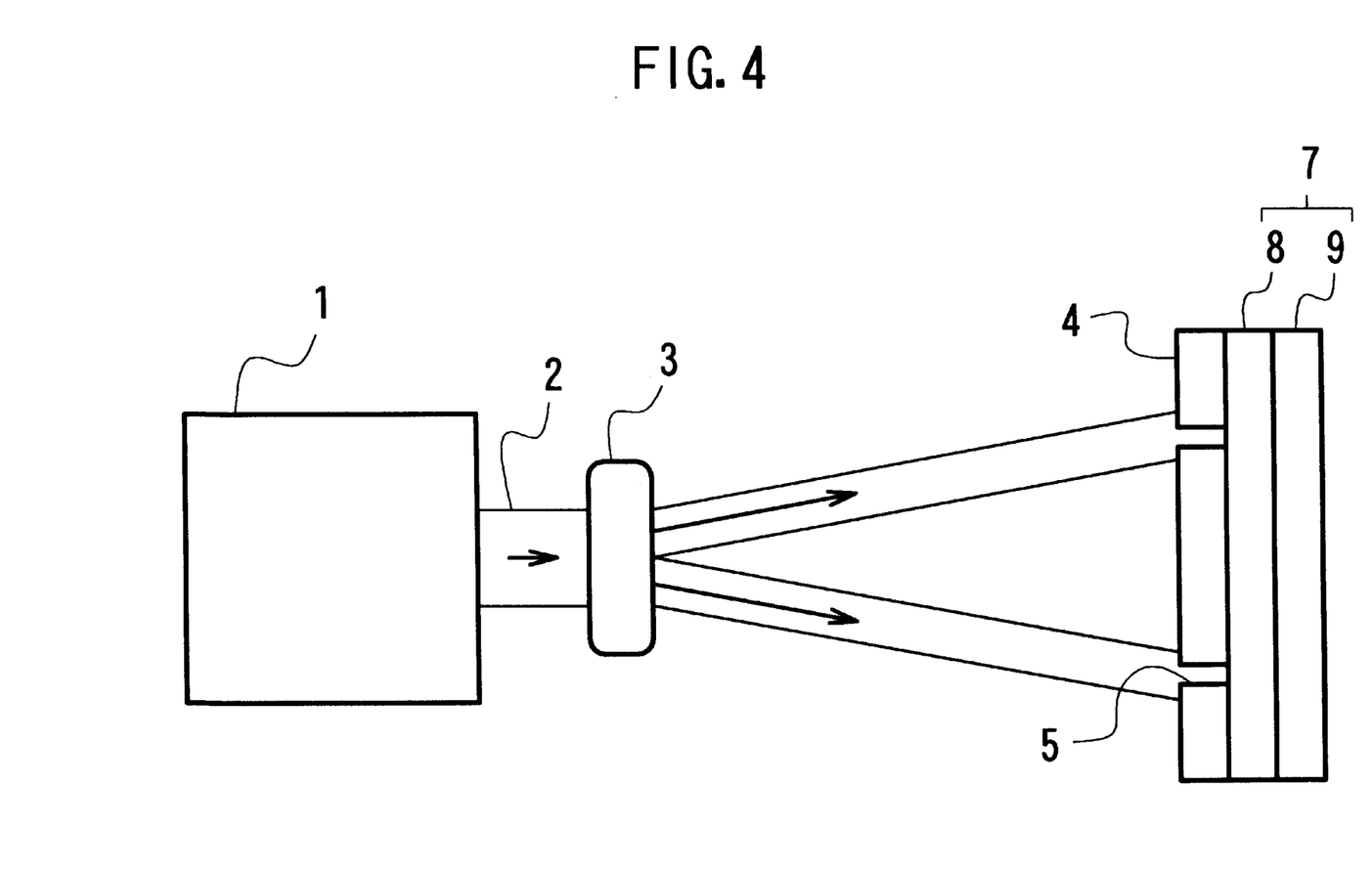
FIG. 4 shows another example of the inventive method for forming a hole in a printed board, wherein a through-hole is formed in the printed board by a contact mask method.

The mask imaging method comprises laser beam irradiation to form a hole, through a mask having light path holes (e.g., through-holes of circle, rectangular, rhomboid and the like) corresponding to the shape of the holes to be formed, arrangement pattern thereof and the like. The mask imaging method includes a contact mask method and a conformal mask method wherein the mask is superimposed on a resin layer, and a mask projection method wherein an imaging lens is placed in between a mask and a printed board to form an image on a resin layer using a laser beam. Therefore, the mask 4 may be located away from a printed board as shown in FIG. 1, or superimposed on the resin layer 8 of the printed board 7, as shown in FIG. 4.

An imaging lens used for mask imaging method may be placed as necessary between the mask and the printed board.

The removal of residue according to the present invention is explained in the following.

As shown in FIG. 8(a), in the production of a printed board, a hole (through-hole in the Figure) is formed in a printed board 7 having a conductive layer 9 on one side of a resin layer 8, by irradiation of a laser beam 19. In so doing, a decomposition product residue and processing residue adhere to the vicinity and inside of the through-hole 10, as shown in FIG. 8(b).

Figure 8C:
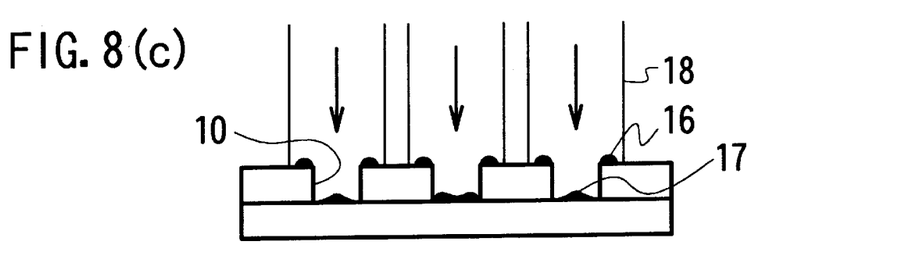

As shown in FIG. 8(c), the decomposition product residue 16 and processing residue 17 adhering to the vicinity and inside of the through-hole 10 are decomposed by irradiation or a laser beam 18 having a wavelength permitting laser ablation processing. Hereinafter the laser beam having a wavelength permitting laser ablation processing is referred to as a residue and debris removing laser beam.

Figure 8D:
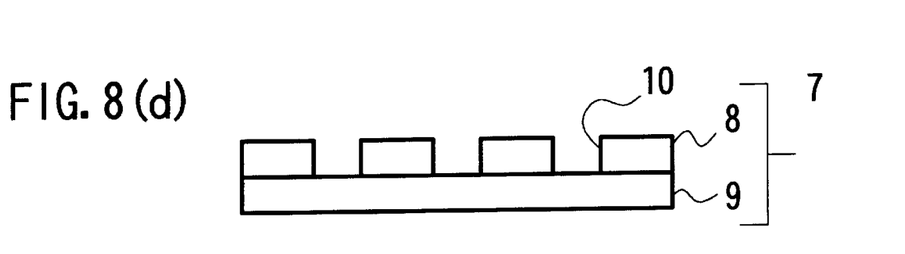

As shown in FIG. 8(d), irradiation of a residue and debris removing laser beam affords a printed board 7 free of the decomposition product residue 16 or processing residue 17.

Figure 8E:
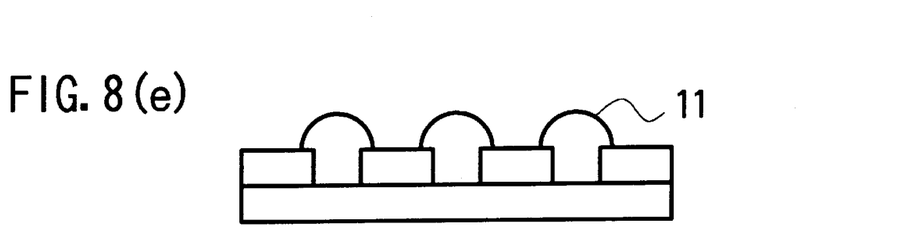

As shown in FIG. 8(e), a metal material to be a contact material is filled in a through-hole 10, from which the residue has been removed, by electroplating using a conductive layer 9 as a negative electrode, and protruded from the through-hole 10 to form a bump electrode 8.

The laser ablation conventionally used exclusively for forming a hole is used for removing the decomposition product residue and processing residue attached to the inside or vicinity of a hole (particularly through-hole), whereby such residues that have been difficult to remove heretofore can be easily removed appropriately.

In particular, in the same manner as in forming a hole in the present invention, the sectional shape of the laser beam for residue removal is reshaped using the beam reshaping optics. As a consequence, residue and debris removing laser beam irradiation can be effected at once for every hole in a printed board, from which the residues are to be removed, and the residue removal is done in a shorter time than when scanning is conducted for the same purpose.

It is also possible to direct the residue and debris removing laser beam which may be wasted by shooting the resin layer surface between holes, to the holes by the beam reshaping optics, so that the residue and debris removing laser beam can be fully utilized.

While a laser source used to form through-holes and the like in the resin layer of a printed board, from which the residues are to be removed, is not particularly limited, one capable of greater irradiation output is preferable, which is exemplified by excimer laser source, $CO_2$ laser source, YAG laser source and the like. A dry etching processing using a laser beam output from the above-mentioned laser source may be used for forming a through-hole. Of these, the use of an ultraviolet laser such as KrF excimer laser (wavelength 248 nm), XeCl excimer laser (wavelength 308 nm) and 3rd or 4th harmonic YAG laser results in a high aspect ratio to enable fine hole-forming performance.

The residue and debris removing laser beam preferably has an energy density on the irradiation surface of not less than 200 $mJ/cm^2$, in view of the threshold value of a residue decomposition energy. Moreover, the residue and debris removing laser beam irradiation may be done plural times per one irradiation target. Particularly, when all through-holes are irradiated at once, plural times of irradiation are preferable, wherein the irradiation includes not more than 20 shots, preferably 10 shots or less. The thickness of the resin layer to be dug down by the laser beam irradiation is adjusted to be not more than 3 $\mu$m, preferably not more than 2 $\mu$m, particularly preferably not more than 1 $\mu$m, so that the irradiation does not damage the resin layer. The above-mentioned mask imaging method may be also used for residue and debris removing laser beam irradiation.

Figure 9A:
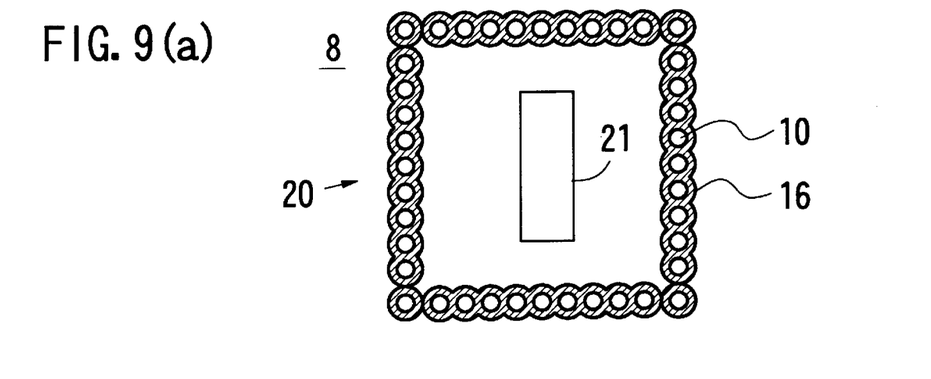
FIG. 9(a) to FIG. 9(c) show examples of the process for removing a residue according to the present invention, wherein the irradiation area of the laser beam for removing residue on a resin layer 8 is shown and the outer shape of the resin layer 8 is omitted.

FIG. 9(a) shows the arrangement pattern 20 of through-holes 10 and a sectional shape (section perpendicular to the advancing direction of said beam, i.e., irradiation area) 21 of the residue and debris removing laser beam in a contrastive manner. The residue and debris removing laser beam is an excimer laser beam. As shown in FIG. 9(a), the beam section 21 of the excimer laser beam is typically rectangular and of the size of about 25 mm×15 mm. Thus, scanning is necessary for removing the decomposition product residue 16.

Figure 9B:
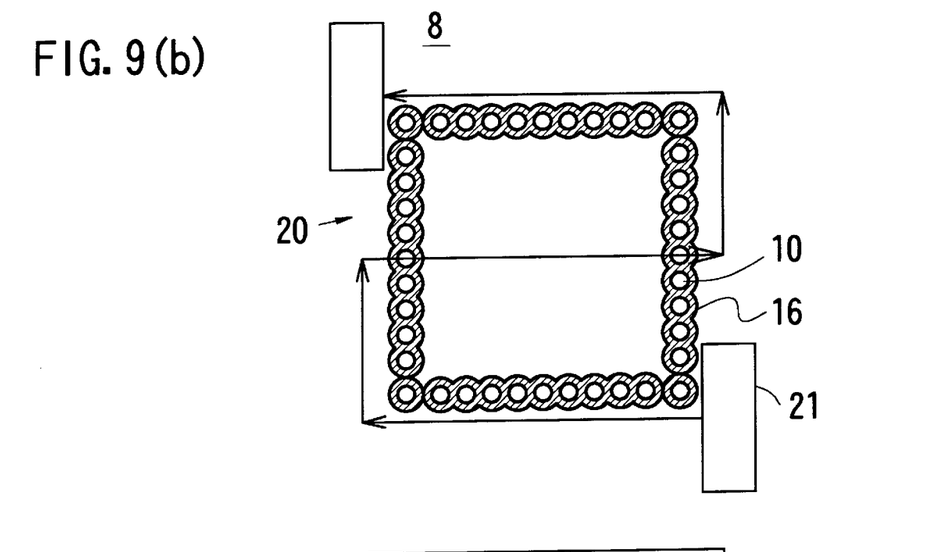

FIG. 9(b) shows scanning of the irradiation targets, wherein the laser scanning is conducted following the pattern 20 of through-holes 10 (in FIG. 9(b), the route shown by the arrows).

Figure 9C:
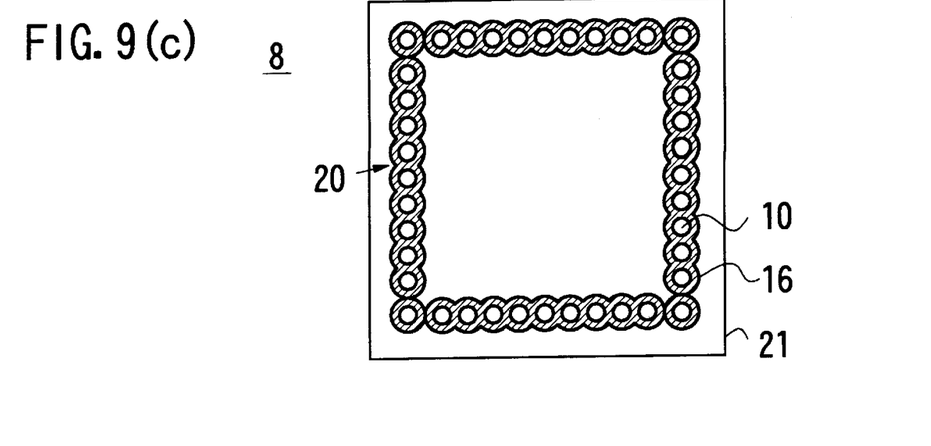

FIG. 9(c) shows exposure of a resin layer after enlarging a laser beam with a beam magnification optical system.

Figure 10:
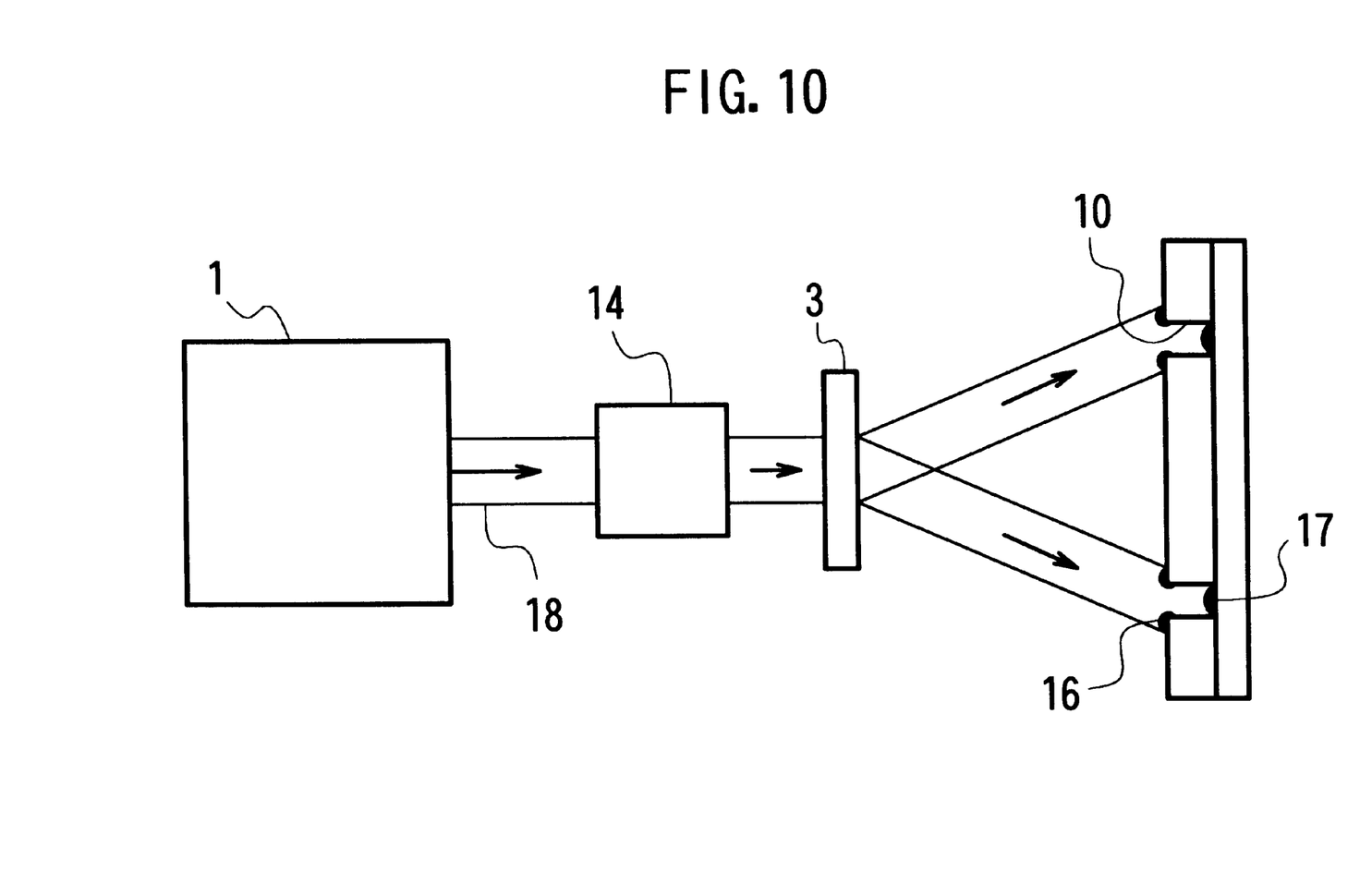
FIG. 10 shows another example of the process for removing a residue according to the present invention.

FIG. 10 shows another example of removal of residue in the process of the present invention, specifically using the beam reshaping optics 3.

In the embodiment of FIG. 10, the residue and debris removing laser beam 18 which has been output from the light source 1 passes through the beam reshaping optics 3. The laser beam 18 reshaped by the beam reshaping optics simultaneously shoots the entire through-holes 10 and the vicinity thereof, and a decomposition residue 16 and a processing residue 17 are removed. Note that 14 is a variable attenuator having a function of continuously changing the output of the laser.

FIG. 11 shows the laser beam irradiation areas on the surfaces of resin layers 8 in the step shown in FIG. 10. The laser beam for removing the residue and debris is an excimer laser beam.

Figure 11A:
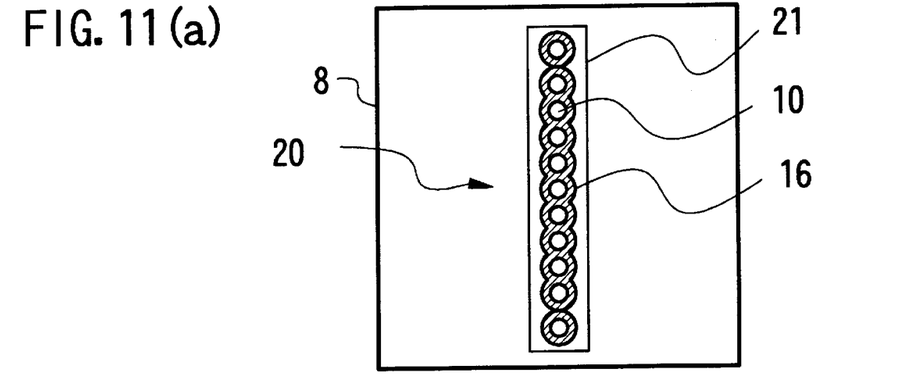
FIG. 11(a) to FIG. 11(c) show the areas of a resin layer exposed to a laser beam by the method of FIG. 10.
Figure 11B:
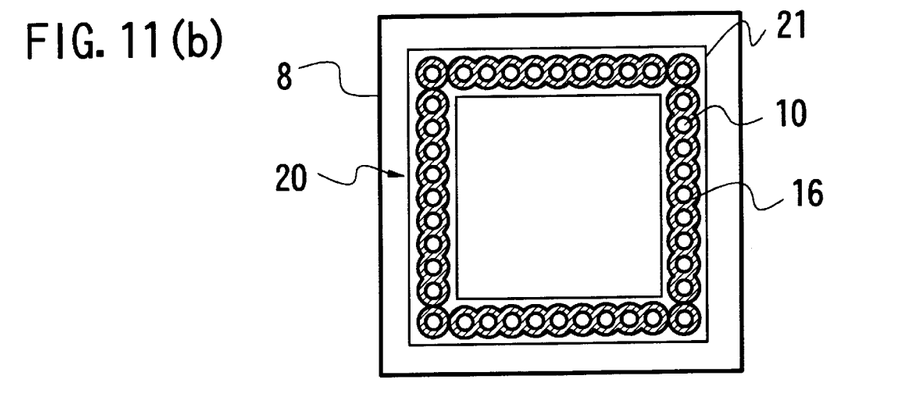
Figure 11C:
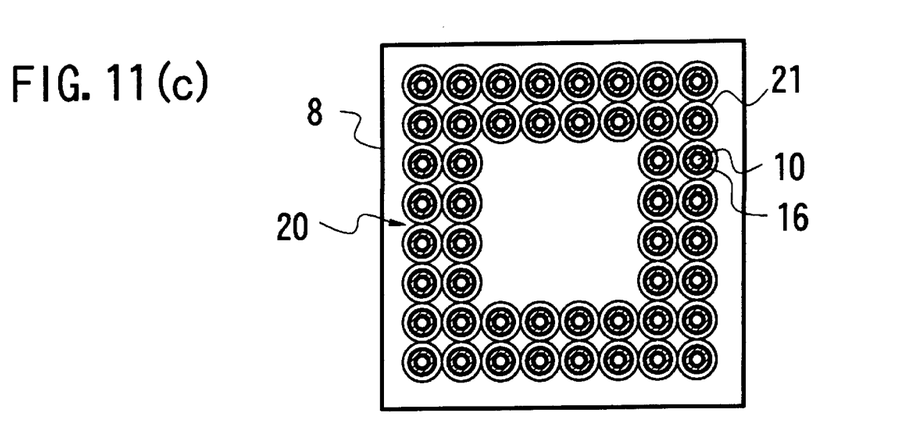

As shown in FIG. 11(a), (b), (c), the sections (irradiation areas) 21 of the beams have been reshaped by the beam reshaping optics, so that the entire through-holes 10 and the vicinity thereof formed in the resin layers 8 to be the irradiation targets are simultaneously irradiated with the laser beams.

By reshaping the section 21 of the beam, the energy utility efficiency becomes high, and effective irradiation over the vicinity of a through-hole, which requires complete removal of residues when forming a bump electrode, is attained. In addition, simultaneous exposure of the entire target inhibits re-attaching of the residue that once rose by the laser beam irradiation, which is different from the case of scanning.

When the irradiation target is polyimidesiloxane, the residue mainly containing carbon can be removed by the method of the present invention, but the residue mainly containing polysiloxane sometimes remains. In this case, washing with water using ultrasonic wave of about 40 KHz, 1000 W easily removes the remaining residue.

As shown in FIG. 11, in the case of simultaneous exposure of the entire target, it is preferable to set the total sectional area of the laser beam reshaped by the beam reshaping optics to 200%–10000%, particularly 400%–6000%, of the total sectional area of the holes formed in the resin layer of a printed board, for the inhibition of re-attaching of the residue.

In the residue and debris removing laser beam irradiation, it is preferable that oxygen gas and/or helium gas be concurrently blown onto the irradiation area. By blowing such gases, attaching of a trace amount of decomposition residue to the periphery of the laser beam irradiation area can be most advantageously suppressed. It is also possible to blow gases during the laser beam irradiation for forming a through-hole. However, the long irradiation time necessitates consideration of costs and safety. The time for the laser beam irradiation for removal of the residue is $\frac{1}{10}$–$\frac{1}{100}$ or less of the time necessary for forming a hole, so that these issues need not be considered.

The production of a printed board by the hole forming method of the present invention is exemplified in the following.

EXAMPLE A1

Using KrF excimer laser (wavelength 248 nm, 350 mJ/pulse) as a light source, holes were formed in a printed board by an imaging system using a ⅕ magnification imaging lens. As the printed board, used was one having a 18 $\mu$m thick copper layer on one surface of a 25 $\mu$m thick polyimide resin layer. As the mask, used was a quartz substrate (thickness 2 mm) subjected to chromium evaporation on the surface thereof and having 50 through-holes having a diameter of 250 $\mu$m per side, totaling in 200 holes, arrayed on the sides of a 50 mm square.

Then, the light source output a laser beam having a rectangular (25 mm×10 mm) sectional shape, and the beam was reshaped by a diffractive optical element to have a square frame sectional shape (outside shape: 50.5 mm×50.5 mm, inside shape: 49.5 mm×49.5 mm), as shown in FIG. 11(b). The reshaped laser beam passed through the light path holes formed in the mask to shoot the printed board. The sectional area of the reshaped beam was 100 $mm^2$, the total sectional area of the light path holes was 9.8 $mm^2$ and the sectional area of the beam was 1020% of the total sectional area of the light path holes. As a result, the polyimide resin layer had 50 through-holes having a diameter of 50 $\mu$m per side, totaling in 200 holes, of a 10 mm square at once. The time necessary for the above-mentioned processing was 0.4 sec and the energy utility efficiency was about 5%.

EXAMPLE A2

In the same manner as in Example A1 except that XeCl excimer laser (wavelength 308 nm, 300 mJ/pulse) was used as the light source, and the sectional shape of the beam was an array of 200 circles on the sides of a 50 mm square, each circle having a diameter of 350 $\mu$m, at the same pitch as the through-holes in the mask of Example A1, a printed board was exposed to the beam. As a result, the holes similar to those obtained in Example A1 were formed simultaneously. The total sectional area of the reshaped beam was 19.23 mm$^2$, the total sectional area of the light path holes was 9.8 mm$^2$ and the total sectional area of the beam was 196% of the total sectional area of the light path holes.

Comparative Example A1

In the same manner as in the above Examples except that a diffractive optical element was not used, a laser beam scanning was conducted. The time necessary for the above-mentioned processing was 30 sec and the decomposition product of the resin layer was adhered to the inside and the vicinity of the hole. The energy utility efficiency was not more than 0.1%.

According to the above-mentioned Examples and Comparative Example, it was clear that the process of the present invention can shorten the processing time of the holes and improve the energy efficiency. In addition, the amount of the decomposition product adhering to the inside and the vicinity of the holes could be decreased more than by conventional methods. Therefore, the production cost can be reduced, and abnormal growth of a bump electrode can be inhibited, whereby a high quality probe can be obtained.

In the following Examples, the residue was removed by the inventive method and a probe having a bump electrode was produced.

EXAMPLE B1
(Formation of Holes)

Using XeCl excimer laser (wavelength 308 nm, 408 mJ/pulse) as a light source, holes were formed in a printed board by a reduction transfer optical system using a ⅕ magnification imaging lens. As the mask, used was a quartz substrate (thickness 2 mm) subjected to chromium evaporation on the surface thereof and having 50 through-holes having a diameter of 250 $\mu$m per side, totaling in 200 holes, arrayed on the sides of a 50 mm square. Then, the mask was exposed to a laser beam which passed through an imaging lens onto the printed board, so that 50 through-holes having a diameter of 50 $\mu$m per side, totaling in 200 holes, were simultaneously arrayed on the sides of a 10 mm square. As the printed board, used was one having a 18 $\mu$m thick copper layer on one surface of a 25 $\mu$m thick polyimide resin layer. The periphery of the holes had black decomposition residue attached in about 0.5 mm width extending outwardly from the edge of the holes.
(Removal of Residue)

Using KrF excimer laser (wavelength 248 nm, 300 mJ/pulse) as a light source, a laser beam was output to the holes arranged in a square frame and the vicinity thereof. The beam passed through a diffractive optical element to reshape its sectional shape from a rectangle (25 mm×10 mm) into a square frame (outside shape: 10.5 mm×10.5 mm, inside shape: 9.5 mm×9.5 mm) corresponding to the arrangement of the above-mentioned holes. Using a variable attenuator having a function of continuously changing the output of the laser, the energy density on the resin layer of the printed board was adjusted to 500 mJ/cm$^2$, and the printed board was exposed 5 times at a repetition rate of 200 Hz, as a result of which the decomposition residue in the irradiation area was completely removed. The sectional area of the reshaped beam was 100 mm$^2$, the total sectional area of the light path holes was 0.39 mm$^2$ and the sectional area of the beam was 5130% of the total sectional area of the light path holes. The depth of the hole in the resin layer was 1.5 $\mu$m.

Then, a trace amount of the decomposition residue attached to the periphery of the area thus exposed was washed with water using ultrasonic wave. Copper was deposited inside the hole by electroplating to form a bump electrode. The bump electrode was free of problems such as deformation and abnormal growth, and of fine quality.

EXAMPLE B2

In the same manner as in Example B1 except that KrF excimer laser (wavelength 248 nm, 350 mJ/pulse) was used as the light source for forming holes, XeCl excimer laser (wavelength 308 nm, 450 mJ/pulse) was used as the light source for removing the residue and debris, the energy density of the resin removal laser beam on the resin layer of the printed board was adjusted to 500 mJ/cm$^2$, one time irradiation at repetition rate of 200 Hz was applied, and a helium gas was blown from a nozzle set at 10 mm from the irradiation surface at a flow rate of 1000 cc/min simultaneously with the laser beam irradiation for removing the residue and debris, a printed board was processed. As a result, the decomposition residue in the irradiation area was completely removed. The total sectional area of the beam was about 5130% of the total sectional area of through-holes as in Example B1. The depth of the hole in the resin layer was 1.5 $\mu$m.

Then, the through-holes were nickel-plated by electroplating to form bump electrodes. The bump electrodes were free of problems such as deformation and abnormal growth and of fine quality.

EXAMPLE B3

The through-holes having a diameter of 200 $\mu$m were formed in a matrix of 10 holes×10 holes at a pitch of 0.5 mm in a printed board same as the one used in Example B1 by galvanoscan method using a $CO_2$ laser.

The matrix holes and the vicinity thereof were exposed to KrF excimer laser (wavelength 248 nm, 250 mJ/pulse) as a light source. By passing the beam through a diffractive optical element, the rectangular sectional shape (25 mm×10 mm) of the beam was reshaped to that of a matrix of 10 holes×10 holes (hole diameter 400 $\mu$m), at a pitch of 0.5 mm, which corresponded to the above-mentioned pattern. The energy density on the resin layer of the printed board was adjusted to 1000 mJ/cm$^2$ using a variable attenuator having a function of continuously changing the output of the laser, and two time irradiation at repetition rate of 200 Hz was applied. As a result, the decomposition residue in the irradiation area was completely removed. The total sectional area of the beam was about 12.56 mm$^2$, the total sectional area of the holes was 3.14 mm$^2$ and the total sectional area of the beam was 400% of the total sectional area of the through-holes. The depth of the hole in the resin layer was 1.0 $\mu$m.

Then, a trace amount of the decomposition residue attached to the periphery of the area thus exposed was washed with water using ultrasonic wave. Gold was deposited on the inner bottom of the hole by electroplating to give a fine plated surface.

Comparative Example B1

In the same manner as in Example B3 except that the sectional shape of the beam was reshaped through a diffractive optical element to that of a matrix of 10 holes×10 holes (hole diameter 250 μm), at a pitch of 0.5 mm, a laser beam irradiation and gold plating were applied to result in abnormal precipitation of gold at the edge portion. The total sectional area of the beam was 156% of the total sectional area of the through-holes.

Comparative Example B2

In the same manner as in Example B1 except that the residue and debris removing laser beam irradiation was omitted, bump electrodes were formed to find abnormal growth thereof. The adjacent bump electrodes were connected, thus failing to form normal bump electrodes.

Comparative Example B3

In the same manner as in Example B3 except that the residue and debris removing laser beam irradiation was omitted, a printed board was immersed in an aqueous solution of potassium permanganate and washed with water using ultrasonic wave. As a result, the decomposition residue attached to the periphery of the holes was completely removed.

When the holes were gold-plated in the same manner as in Example B3, however, some of them were not satisfactorily plated. A close observation of the inner bottom of the hole with a microscope revealed that a processing residue of polyimide resin remained thin on the inner bottom.

From the foregoing Examples and Comparative Examples, it was clarified that bump electrodes free of deformation or abnormal growth could be formed on the print-ed board prepared according to the method of the present invention, without decomposition residue or processing residue. When the beam reshaping optics was used in the residue removal step, the residue could be removed in a short time, and the production cost could be reduced.

This application is based on application Nos. 8-331099 and 8-331285 filed in Japan, the contents of which are incorporated hereinto by reference.

What is claimed is:

1. A method for removing a decomposition residue and/or a processing residue, of a material of a resin layer, which is attached to the periphery and inside of holes formed in the resin layer of a printed board, comprising (a) shooting a laser beam having a wavelength for laser ablation at the holes to thereby remove the decomposition residue and/or the processing residue, (b) reshaping the sectional shape perpendicular to the direction of advance of the laser beam by beam reshaping optics, with the reshaped laser beam shooting simultaneously all the holes and vicinity thereof, wherein the total irradiated area on the printed board is 200%–10000% of the total sectional area of the holes formed in the printed board.

2. The method of claim 1, wherein the laser beam is shot from an excimer laser source.

3. The method of claim 1, wherein the beam reshaping optics is a diffractive optical element.

4. The method of claim 1, further comprising blowing an oxygen gas or a helium gas or both to the periphery and the inside of the holes concurrently with the laser beam irradiation.

5. A method for producing a printed board having holes, comprising forming holes in a resin layer of a printed board by laser processing and removing a decomposition residue and/or a processing residue, of a material of the resin layer, which is attached to the periphery and inside of the holes, by the method of any one of claims 1, 2, 3 and 4.

* * * * *